United States Patent
Lin et al.

(10) Patent No.: US 7,453,312 B2
(45) Date of Patent: Nov. 18, 2008

(54) VOLTAGE REGULATOR OUTPUTTING POSITIVE AND NEGATIVE VOLTAGES WITH THE SAME OFFSETS

(75) Inventors: Yen-Tai Lin, Hsin-Chu (TW); Ching-Yuan Lin, Hsin-Chu Hsien (TW)

(73) Assignee: eMemory Technology Inc., Science Park, Hsinchu (TW)

( * ) Notice: Subject to any disclaimer, the term of this patent is extended or adjusted under 35 U.S.C. 154(b) by 0 days.

(21) Appl. No.: 12/116,229

(22) Filed: May 7, 2008

(65) Prior Publication Data
US 2008/0218252 A1    Sep. 11, 2008

Related U.S. Application Data

(62) Division of application No. 11/380,661, filed on Apr. 28, 2006, now Pat. No. 7,427,889.

(51) Int. Cl.
*G05F 1/10* (2006.01)
(52) U.S. Cl. ............................ 327/535; 327/78; 327/537
(58) Field of Classification Search ......... 327/535–537; 363/59, 60
See application file for complete search history.

(56) References Cited

U.S. PATENT DOCUMENTS

| | | | |
|---|---|---|---|
| 4,820,933 A | 4/1989 | Hong | |
| 5,306,954 A | 4/1994 | Chan et al. | |
| 5,969,513 A | 10/1999 | Clark | |
| 6,188,212 B1 | 2/2001 | Larson | |
| 6,278,317 B1 | 8/2001 | Hsu | |
| 6,519,191 B1* | 2/2003 | Morishita | 365/189.09 |
| 6,717,458 B1 | 4/2004 | Potanin | |
| 6,756,838 B1 | 6/2004 | Wu et al. | |
| 6,819,619 B2* | 11/2004 | Morishita et al. | 365/226 |
| 6,927,620 B2 | 8/2005 | Senda | |
| 7,276,960 B2 | 10/2007 | Peschke | |
| 2002/0041531 A1* | 4/2002 | Tanaka et al. | 365/205 |
| 2004/0150463 A1* | 8/2004 | Senda | 327/534 |
| 2007/0252640 A1* | 11/2007 | Lin et al. | 327/541 |

* cited by examiner

*Primary Examiner*—Long Nguyen
*Assistant Examiner*—Ryan C Jager
(74) *Attorney, Agent, or Firm*—Winston Hsu

(57) ABSTRACT

A voltage regulator has a first charge circuit, a second charge circuit, and a control circuit. The control circuit has five input terminals and two output terminals. The five input terminals are respectively coupled to a reference voltage, a first voltage source, a second voltage source, an output terminal of the first charge circuit, and an output terminal of the second charge circuit. The control circuit equalizes a voltage difference between the output terminal of the first charge circuit and the first voltage source and a voltage difference between the second voltage source and the output terminal of the second charge circuit.

11 Claims, 7 Drawing Sheets

VOLTAGE REGULATOR OUTPUTTING POSITIVE AND NEGATIVE VOLTAGES WITH THE SAME OFFSETS

CROSS REFERENCE TO RELATED APPLICATIONS

This application is a division of U.S. application Ser. No. 11/380,661 filed Apr. 28, 2006 now U.S. Pat. No. 7,427,889, and incorporated herein by reference in its entirety.

BACKGROUND OF THE INVENTION

1. Field of the Invention

The present invention generally relates to a voltage regulator, and more particularly, to a voltage regulator outputting positive and negative voltages with the same offsets.

2. Description of the Prior Art

The era of digital information has arrived which has pushed the development of electronic information processing devices such as computers, wireless devices, personal digital assistants (PDAs), portable multimedia players/recorders, and the like in the recent years. One crucial component to any electronic information processing device is the memory device which has gone under substantial advancement. The performance in speed and reliability along with the size and packaging of these memory devices have greatly improved, and as a result smaller and faster memory devices are continuously being introduced to the market.

In order to reduce power consumption and extend battery life, much of the integrated circuitry such as memory devices used in portable devices is being designed to run at low voltage levels. This reduces the power usage and reduces the heat generated by the circuit components allowing more components to be placed closer to one another. The circuitry and components used in portable computers typically are being designed to operate at voltages levels substantially less than the previous standard of 5V, with 1.0V and lower becoming increasingly common.

Many designs used a technique called "bootstrapping" to generate higher amplitude clock signals to compensate for the increased effective threshold voltages relative to the supply voltage. The bootstrapping technique involves the use of a charge capacitor that charges on every clock pulse and discharges between pulses, adding the discharged voltage to the original input voltage of the bootstrapping circuit so the output could be multiplied to a number of times the original input. Applying a uniform high clock voltage, generated by bootstrapping, leads to energy inefficiency because the greater the current delivered by the clocking voltage, the less efficient the bootstrapping operation. In the latter stages where high voltages are required, this inefficiency was unavoidable. In the initial stages of the charge pump, whereas high a voltage is not needed, the clock bootstrapping operation was inefficient.

Different approaches to designing charge pumps were previously disclosed, for example U.S. Pat. No. 6,756,838 "Charge pump based voltage regulator with smart power regulation", U.S. Pat. No. 5,306,954 "Charge pump with symmetrical +V and −V outputs", and U.S. Pat. No. 6,717,458 "Method and apparatus for a DC-DC charge pump voltage converter-regulator circuit". Please refer to FIG. 1, which is a general schematic diagram of a charge pump circuit 10 disclosed in U.S. Pat. No. 5,306,954. An oscillator is used to generate switch signals S1, S2, S3, and S4 to control the operations of the switches. Therefore, each of the capacitors 12, 14, 16, and 18 of the charge pump circuit 10 are charged and discharged repeatedly to pump the voltage levels of the output terminals of the charge pump circuit 10 to +2V and −2V respectively. However, because the voltage offset of the negative terminal of the charge pump circuit 10, i.e. 2V (from GND to −2V), is greater than the offset positive terminal of the charge pump circuit 10, i.e. 1V (from +V to +2V), the capacitance of the capacitor 16 used for storing the negative pump charge is greater than the capacitance of the capacitor 18 used for storing the positive pump charge.

Please refer to FIG. 2, which is a diagram used to illustrate voltage adjustment of prior art voltage regulators. The two input terminals of the prior voltage regulator respectively are coupled to a first voltage source $V_{DD}$ and a second voltage source $V_{SS}$. The first voltage source $V_{DD}$ provides a positive voltage, and the second voltage source $V_{SS}$ is connected to the ground. In general, the voltage regulator comprises a first pump circuit and a second pump circuit to pump up or pump down the voltage level the output terminals of the voltage regulator by charging and discharging. The first pump circuit pumps up the output voltage from $V_{DD}$ to $V_{PP}$, the second pump circuit pumps down the output voltage from $V_{SS}$ to $V_{BB}$. The difference between $V_{PP}$ and $V_{BB}$ is equal to $V_H$, i.e. $|V_{PP}-V_{BB}|=V_H$, and the difference between $V_{SS}$ and $V_{BB}$ is equal to $V_{PP}$, i.e. $|V_{SS}-V_{BB}|=V_{PP}$. Therefore, the offset of the output voltage of the first pump circuit $\Delta V_1$ is greater than the offset of the output voltage of the second pump circuit $\Delta V_2$. In such structure, the number of the capacitors of the first pump circuit is less than the number of the capacitors of the second pump circuit. Hence, the energy transforming efficiency of the second pump circuit is less the energy transforming efficiency of the first pump circuit. Moreover, because the voltage gap $\Delta V_2$ maintained by the second pump circuit is greater than the voltage gap $\Delta V_1$ maintained by the first pump circuit, the capacitance of the capacitor of the second pump circuit is greater than the capacitance of the capacitor of the first pump circuit. Hence, the area of the capacitor of the second pump circuit is greater than the capacitance of the capacitor of the first pump circuit. Briefly summarized, the second pump circuit of the voltage regulators according to the prior art have disadvantages as follows: having poor energy transforming efficiency and an undue size of its capacitor.

SUMMARY OF THE INVENTION

The present invention provides a voltage regulator coupled to a first voltage source and a second voltage source. The voltage regulator comprises a first pump circuit coupled to the first voltage source; a second pump circuit coupled to the second voltage source; and a control circuit comprising a first resistor having a first end coupled to an output terminal of the first pump circuit; a second resistor having a first end coupled to a second end of the first resistor and a second end coupled to an output terminal of the second pump; a first transistor having a first terminal coupled to the output terminal of the first pump circuit and a second end coupled to the second end of the first resistor; a second transistor having a first end coupled to a third terminal of the first transistor, a second end and a third end both coupled to the second voltage source; a first voltage comparison circuit having a first input terminal coupled to a reference voltage and a second input terminal coupled to the third terminal of the first transistor; a first voltage divider coupled to the output terminal of the first pump circuit and the output terminal of the second pump; a second voltage divider coupled to the first voltage source and the second voltage source; and a second voltage comparison circuit having a first input terminal coupled to the output terminal of the first voltage divider, a second input terminal coupled to the output terminal of the second voltage divider, and a third input terminal coupled to an output terminal of the first voltage comparison circuit, the second voltage comparison circuit being used for controlling operations of the first pump circuit and the second pump circuit according to the voltage levels of the three input terminals of the second voltage comparison circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
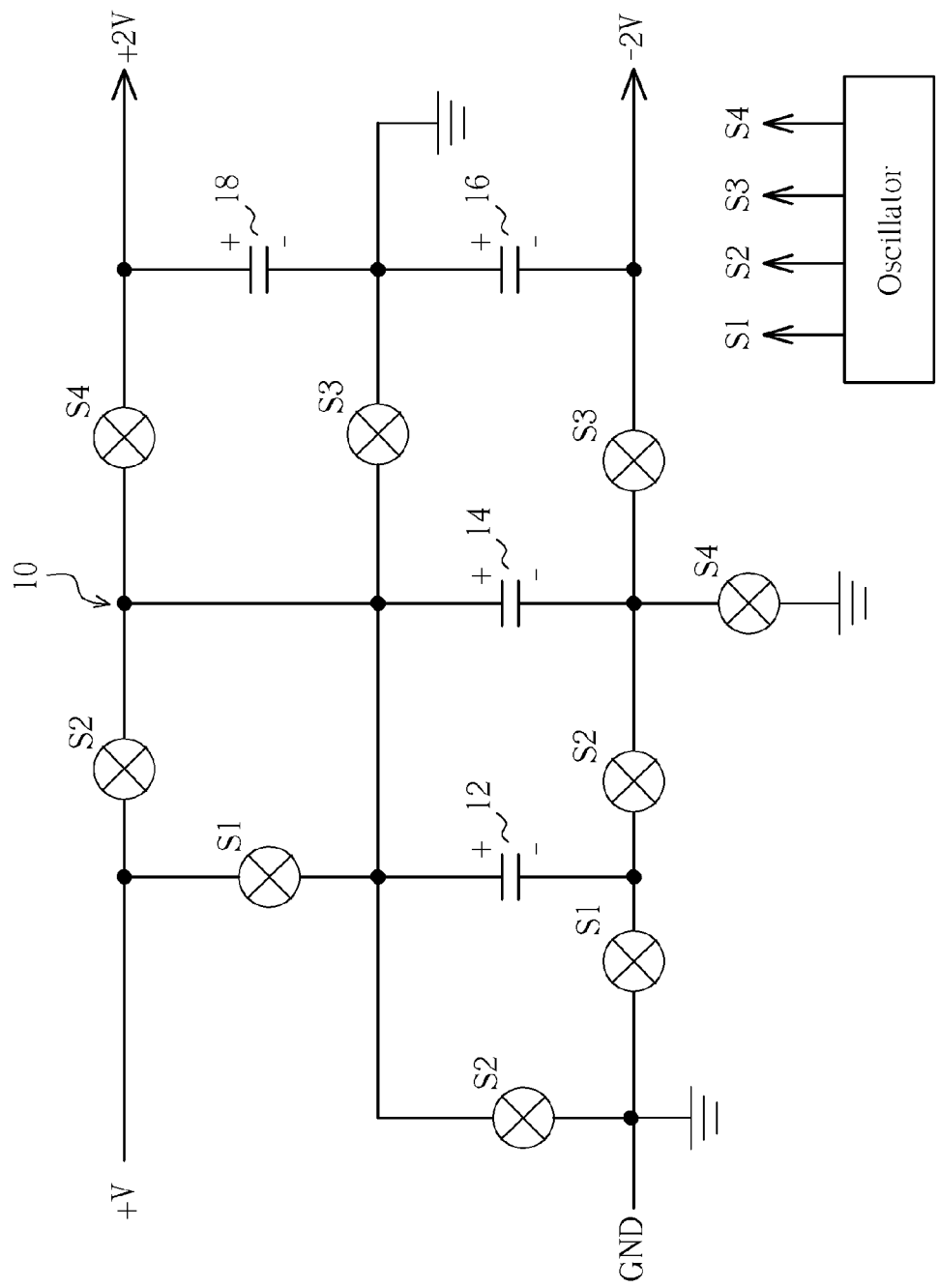
FIG. 1 is a general schematic diagram of a prior art charge pump circuit.
Figure 2:
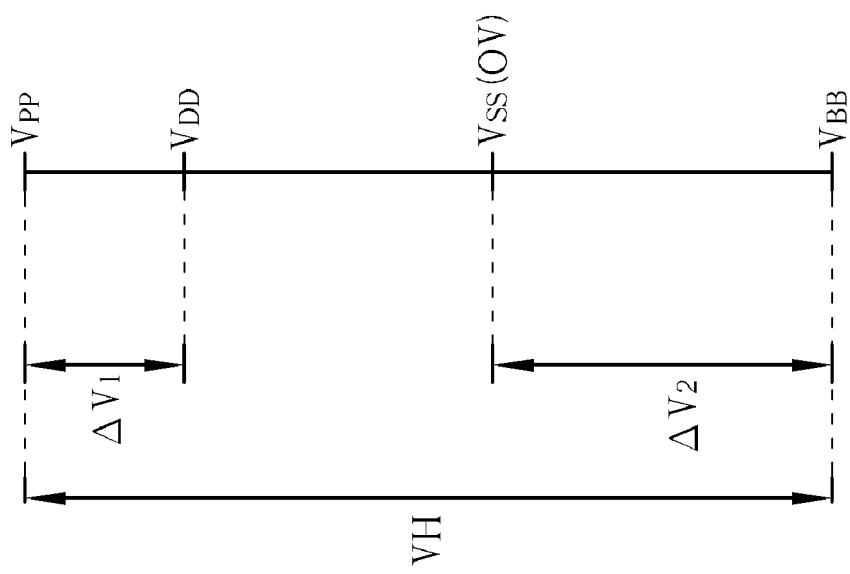
FIG. 2 is a diagram used to illustrate voltage adjustment of prior art voltage regulators.
Figure 3:
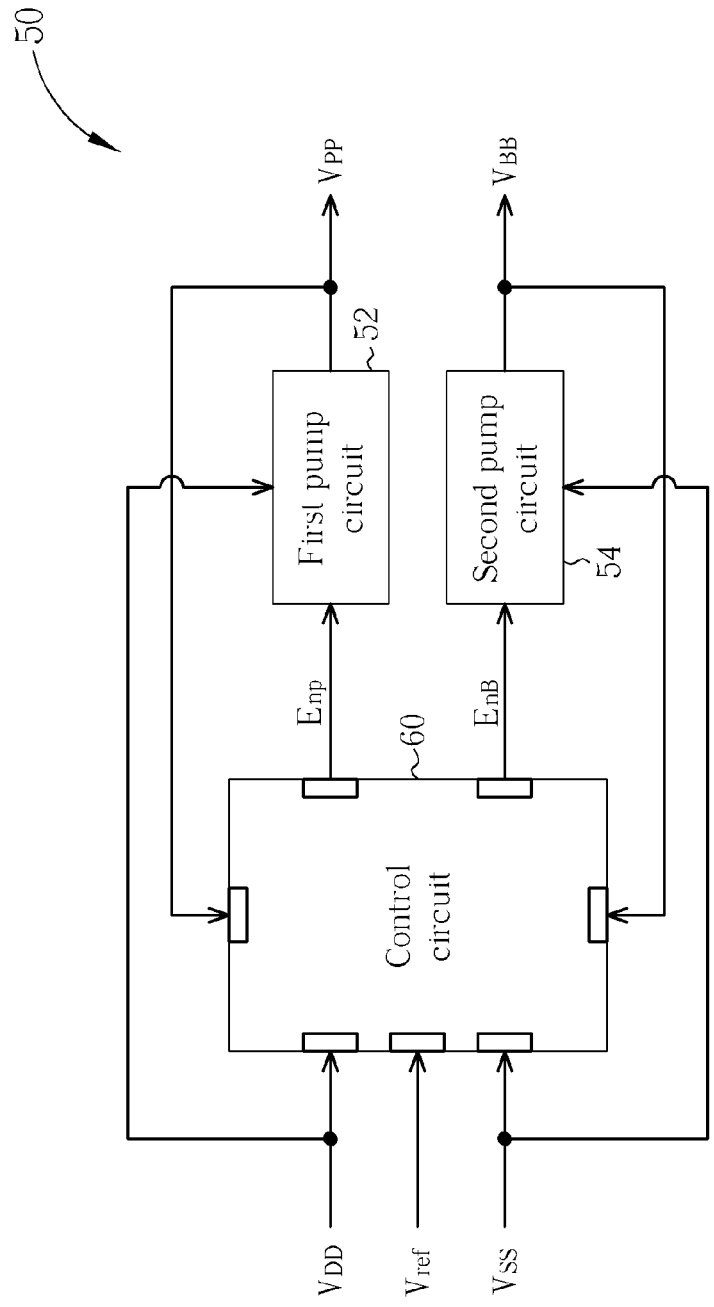
FIG. 3 is a block diagram of a voltage regulator according to the present invention.

Please refer to FIG. 3, which is a block diagram of a voltage regulator 50 according to the present invention. The voltage regulator comprises a first pump circuit 52, a second pump circuit 54, and a control circuit 60. The first pump circuit 52 pumps up the voltage level of one of the two output terminals of the voltage regulator 50 and the second pump circuit 54 pumps up the voltage level of another output terminal of the voltage regulator 50 by repeatedly charging and discharging the capacitors as did the prior art. Therefore, the description for explaining how the first pump circuit 52 and the second pump circuit 54 pump the voltage levels of the output terminals should be referred to the above three mentioned U.S. patents and will not be repeated. The first pump circuit 52 is coupled to a first voltage source $V_{DD}$ and used to output a positive voltage $V_{PP}$ that is higher than $V_{DD}$. The second pump circuit 54 is coupled to a second voltage source $V_{SS}$ and used to output a negative voltage $V_{BB}$ that is less than $V_{BB}$. The control circuit 60 has five input terminals respectively coupled to the first voltage source $V_{DD}$, the second voltage source $V_{SS}$, a reference voltage $V_{ref}$, the output terminal of the first pump circuit 52, and the output terminal of the second pump circuit 54. The control circuit 60 generates a first control signal $E_{nP}$ and a second control signal $E_{nB}$ according to the voltage levels of the five input terminals so as to respectively control the operations of the first pump circuit 52 and the second pump circuit 54.

Figure 4:
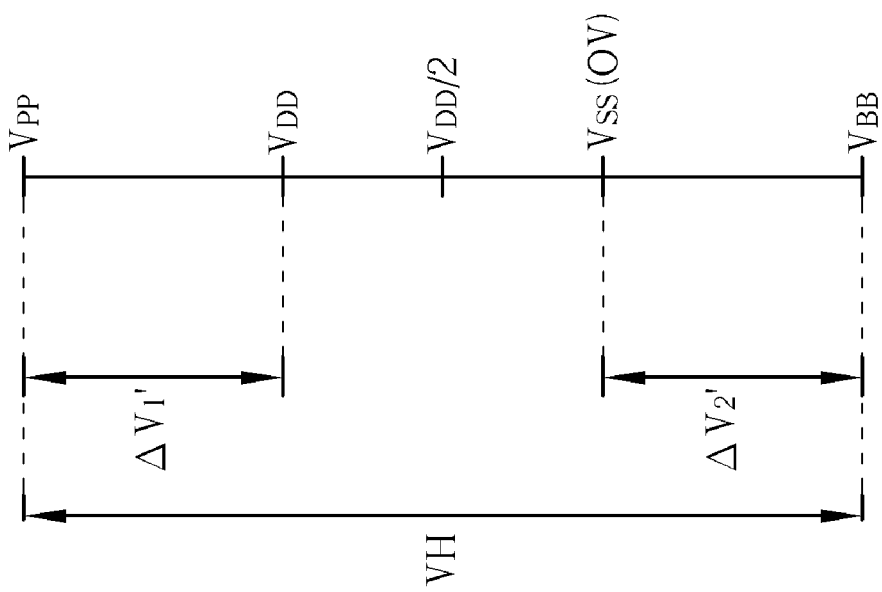
FIG. 4 is a diagram used to illustrate voltage adjustment of the voltage regulators according to the present invention.

Please refer to FIG. 4, which is a diagram used to illustrate voltage adjustment of the voltage regulators according to the present invention. Similar to the prior art, the first pump circuit 52 of the voltage regulator 50 pumps up the positive output voltage level from $V_{DD}$ to $V_{PP}$, and the second pump circuit 54 of the voltage regulator 50 pumps down the negative output voltage level from $V_{SS}$ to $V_{BB}$. However, it should be noted that the offset of the positive voltage ($V_{PP}$-$V_{DD}$) is equal to the offset of the negative voltage ($V_{BB}$-$V_{SS}$). In other words, the offset $\Delta V_1$ is equal to the offset $\Delta V_2$. In addition, in order to make the next stage circuit of the voltage regulator 50 operate regularly, the difference between $V_{PP}$ and $V_{BB}$ is still equal to VH as with the prior art, and the voltage level is $V_{DD}/2$ instead of the original base voltage level $V_{SS}$, i.e. the ground, to become the new base voltage level.

Figure 5:
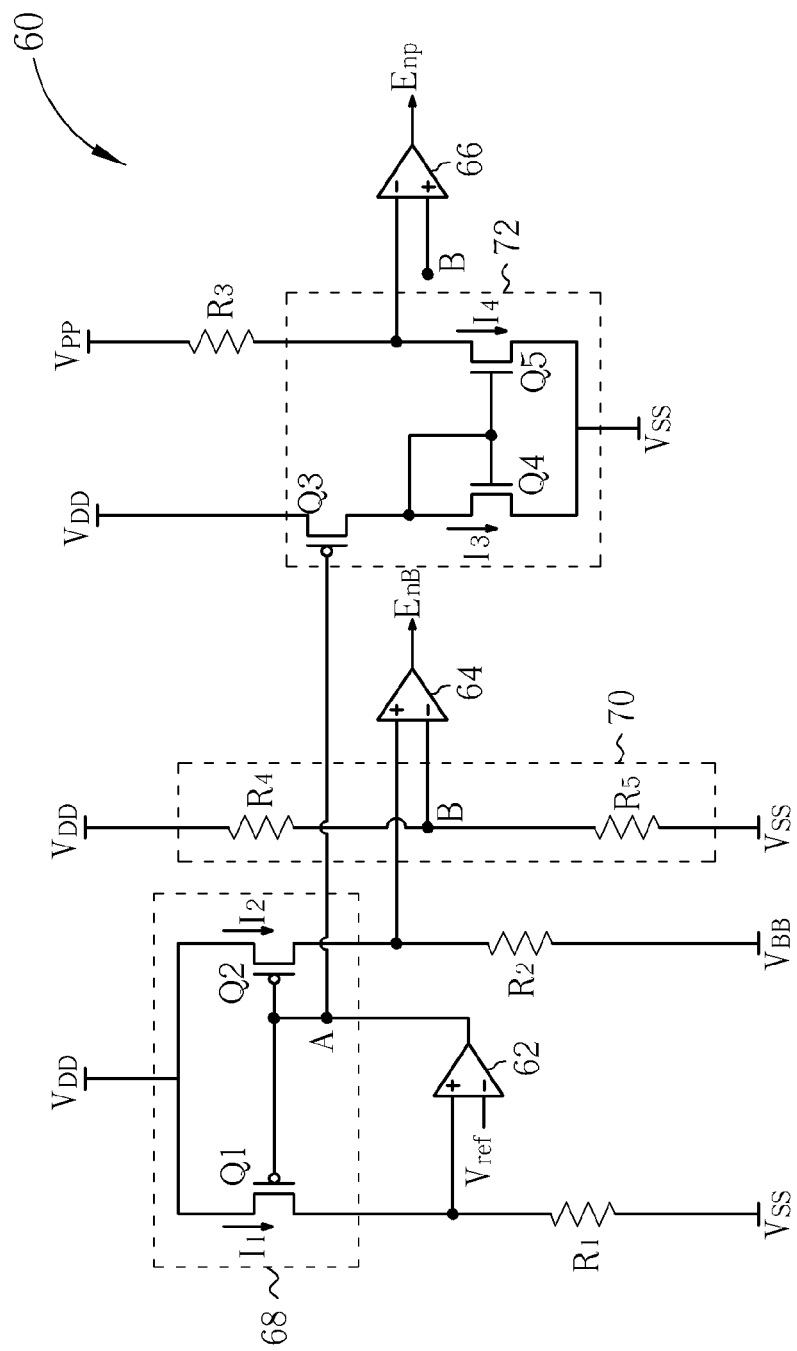
FIG. 5 is a circuit diagram of the control circuit of the voltage regulator shown in FIG. 3.

Please refer to FIGS. 3-5. FIG. 5 is a circuit diagram of the control circuit 60 of the voltage regulator 50. The control circuit 60 comprises a first resistor $R_1$, a second resistor $R_2$, a third resistor $R_3$, a first voltage comparison circuit 62, a second voltage comparison circuit 64, a third voltage comparison circuit 66, a first current mirror 68, a second current mirror 72, and a voltage divider 70. In the embodiment, the first voltage comparison circuit 62, the second voltage comparison circuit 64, and the third voltage comparison circuit 66 are operational amplifiers. The first current mirror 68 comprises a first transistor Q1 and a second transistor Q2. In the embodiment, the first transistor Q1 and the second transistor Q2 are P-type metal-oxide semiconductor (PMOS) transistors. The first transistor Q1 and the second transistor are gate-coupled, and the sources of the two transistors Q1 and Q2 are coupled to the first voltage source $V_{DD}$. The drain of the first transistor Q1 is coupled to the upper end of the first resistor $R_1$, and the drain of the second transistor Q2 is coupled to the upper end of the second resistor $R_2$. The lower end of the first resistor $R_1$ is coupled to the second voltage source $V_{SS}$, and the lower end of the second resistor $R_2$ is coupled to the output terminal $V_{BB}$ of the second pump circuit 54. A reference voltage $V_{ref}$ is coupled to the negative input terminal of the first voltage comparison circuit 62, and the positive input terminal of the first voltage comparison circuit 62 is coupled to the upper end of the first resistor $R_1$. When the voltage level of the upper end of the first resistor $R_1$ is less than the reference voltage $V_{ref}$, the voltage level of the output terminal of the first voltage comparison circuit 62 is low so that two transistors Q1 and Q2 are turned on. When the transistors Q1 and Q2 are turned on, a first current $I_1$ flows through the first resistor $R_1$ and a second current $I_2$, which is equal to the first current $I_1$, flows through the second resistor $R_2$. On the other hand, when the voltage difference ($I_1 \times R_1$) between the two ends of the first resistor $R_1$ is greater than the reference voltage $V_{ref}$, the voltage level of the output terminal of the first voltage comparison circuit 62 is high so that the conductivity of the transistors Q1 and Q2 is decreased and that the currents $I_1$ and $I_2$ are decreased. When the first current $I_1$ is decreased, the voltage level of the upper end of the first resistor $R_1$ is below the reference voltage $V_{ref}$ again. Therefore, the conductivity of the transistors Q1 and Q2 are adjusted repeatedly by the first voltage comparison circuit 62. In the embodiment, the reference voltage $V_{ref}$ is equal to 1.25 and $R_2=2.4R_1$. Therefore, the voltage difference between the two ends of the second resistor $R_2$ is equal to 2.4 times of the voltage difference between the two ends of the first resistor $R_1$. While the control circuit 60 operates in a stable state, because $V_{SS}=0$ volts, the voltage level of the upper end of the first resistor $R_1$ is equal to the reference voltage, i.e. 1.25 volts. In addition, because the voltage difference between the second resistor $R_2$ is equal to 3 volts, i.e. 2.4 times 1.25 volts, the voltage level of the upper end of the second resistor $R_2$ is equal to ($V_{BB}$+3 volts).

The voltage divider 70 comprises a fourth resistor $R_4$ and a fifth resistor $R_5$ with the same resistance as the fourth resistor $R_4$. The upper end of the fourth resistor $R_4$ is coupled to the first voltage source $V_{DD}$, and the lower end of the fourth resistor $R_4$ is coupled to the upper end of the fifth resistor $R_5$, so the voltage level of the output terminal B of the voltage divider 70 is equal to $(V_{DD}+V_{SS})/2$. Since VSS=0 volts, the voltage level of the output terminal B of the voltage divider 70 is equal to $V_{DD}/2$. The output terminal B of the voltage divider 70 is coupled to the negative input terminal of the second voltage comparison circuit 64, and the positive terminal of the second voltage comparison circuit 64 is coupled to the upper end of the second resistor $R_2$. When the voltage level of the upper end of the second resistor $R_2$, i.e. $V_{BB}+3$ volts, is greater than the voltage level of the output terminal B, i.e. $V_{DD}/2$, the control signal $E_{nB}$ is high so that the second pump circuit 54 is triggered to be active. When the second pump circuit 54 is active, the voltage level of the output terminal of the second pump circuit 54, i.e. $V_{BB}$, is pulled down. Finally, the voltage level of the output terminal of the second pump circuit 54 is equal to $(V_{DD}/2)$−3 volts, i.e. $V_{BB}=(V_{DD}/2)$−3 volts.

The upper end of the third resistor $R_3$ is coupled to the output terminal of the first pump circuit 52, and the lower end of the third resistor $R_3$ is coupled to the negative terminal of the third voltage comparison circuit 66. In addition, the second current mirror 72 is coupled to the first voltage source $V_{DD}$ and the second voltage source $V_{SS}$. The second current mirror 72 comprises a third transistor Q3, a fourth transistor Q4, and a fifth transistor Q5. The source of the third transistor Q3 is coupled to the first voltage source $V_{DD}$. The gate of the third transistor Q3 is coupled to the output terminal A of the first voltage comparison circuit 62, and the drain of the third transistor Q3 is coupled to the drain of the fourth transistor Q4. Therefore, the third transistor Q3 is gate-coupled with the first transistor Q1 and the second transistor Q2. When the first current mirror 68 generates the first current $I_1$ and the second current $I_2$, a third current $I_3$ having the same value as the first and the second currents $I_1$ and $I_2$ flows through the third transistor Q3. Because the fourth transistor Q4 and the fifth transistor Q5 are gate-coupled and the drain of the fourth transistor Q4 is coupled to the gate of the fourth transistor Q4, the current $I_4$ flowing through the fifth transistor Q5 is equal to the third current $I_3$ which flows through the fourth transistor Q4. In the embodiment, $R_3=R_2=2.4R_1$, and because $I_1=I_2=I_3=I_4$, the voltage level of the lower end of the third resistor $R_3$ is equal to $V_{PP}$−3 volts. When the voltage level of the lower end of the third resistor $R_3$, i.e. $V_{PP}$−3 volts, is less then the voltage level of the output terminal B, i.e. $V_{DD}/2$, the control signal $E_{nP}$ is high and the first pump circuit 52 is triggered to be active. When the first circuit 52 is active, the voltage level of the output terminal of the first pump circuit 52, i.e. $V_{PP}$, is pulled up. Finally, the voltage level $V_{PP}$ is reached $[(V_{DD}/2)+3]$. Therefore, with the structure of the control circuit 60 shown in FIG. 5, the difference between the voltage level $V_{PP}$ of the output voltage of the first pump circuit 52 and the voltage level $V_{DD}/2$ is equal to 3 volts, and the difference between the voltage level $V_{BB}$ of the output voltage of the second pump circuit 54 and the voltage level $V_{DD}/2$ is also equal to 3 volts. It means that the offset $(V_{PP}-V_{DD})$ of the output voltage level of the first pump circuit 52 is equal to the offset $(V_{SS}-V_{BB})$ of the output voltage level of the second pump circuit 54 as shown in FIG. 4 that $\Delta V_1$, is equal to $\Delta V_2$,.

Figure 6:
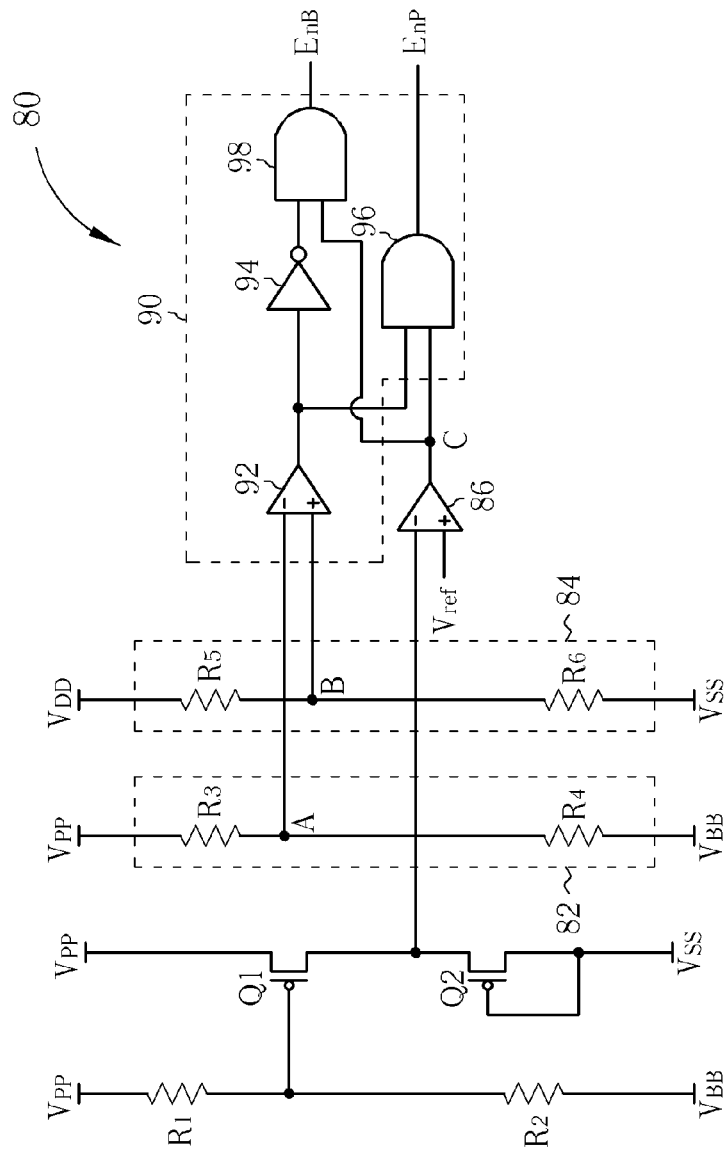
FIG. 6 is a circuit diagram of a second embodiment control circuit of the voltage regulator according to the present invention.

Please refer to FIGS. 3-6. FIG. 6 is a circuit diagram of a second embodiment control circuit of the voltage regulator according to the present invention. The function of control circuit 80 is the same as the function of the control circuit 60 shown in FIG. 3, so the control circuit 60 can be replaced with the control circuit 80. When the control circuit 60 is replaced with the control circuit 80, the input terminals of the control circuit 80 are respectively coupled to the first voltage source $V_{DD}$, the second voltage source $V_{SS}$, the reference voltage $V_{ref}$, the output terminal of the first pump circuit 52, and the output terminal of the second pump circuit 54. The control circuit 80 generates a first control signal $E_{nP}$ and a second control signal $E_{nB}$ to respectively control the operations of the first pump circuit 52 and the second pump circuit 54 according to the voltage levels of its input terminals. The control circuit 80 comprises a first resistor $R_1$, a second resistor $R_2$, a first transistor Q1, a second transistor Q2, a first voltage divider 82, a second voltage divider 84, a first voltage comparison circuit 86, and a second voltage comparison circuit 90. The upper end of the first resistor $R_1$ is coupled to the output terminal $V_{PP}$ of the first pump circuit 52, the lower end of the first resistor $R_1$ is coupled to the upper end of the second resistor $R_2$, and the lower end of the second resistor $R_2$ is coupled to the output terminal $V_{BB}$ of the second pump circuit 54. Therefore, the difference between the voltage levels of the two ends of the first resistor $R_1$ is equal to $[R_1(V_{PP}-V_{BB})/(R_1+R_2)]$. The first transistor Q1 and the second transistor Q2 are PMOS transistors. The source of the first transistor Q1 is coupled to the output terminal $V_{PP}$ of the first pump circuit 52, and the gate of the first transistor Q1 is coupled to the lower end of the first resistor $R_1$. The drain of the first transistor Q1 is coupled to the source of the second transistor Q2, and both the gate and the drain of the second transistor Q2 are coupled to the second voltage source $V_{SS}$. Therefore, the difference between the voltage levels of the source and the drain of the first transistor Q1 is equal to the difference between the voltage levels of the two ends of the first resistor $R_1$, i.e. $[R_1(V_{PP}-V_{BB})/(R_1+R_2)]$. In the embodiment, the first transistor Q1 and the second transistor Q2 have the same electrical characteristics, so the difference between the voltage levels of the source and the gate of the second transistor Q2 is equal to the difference between the voltage levels of the source and the gate of the first transistor Q1, i.e. $[R_1(V_{PP}-V_{BB})/(R_1+R_2)]$. In the condition that $R_2=3.8R_1$, the difference between the voltage levels of the source and the gate of the second transistor Q2 is equal to $(V_{PP}-V_{BB})/4.8$. Because the second voltage source $V_{SS}$ is grounded, the voltage level of the source of the second transistor Q2 is equal to $[(V_{PP}-V_{BB})/4.8]$. The source of the second transistor Q2 is coupled to the negative input terminal of the first voltage comparison circuit 86, and the positive input terminal of the first voltage comparison circuit 86 is coupled to the reference voltage $V_{ref}$. When the voltage level of the source of the second transistor Q2, i.e. $(V_{PP}-V_{BB})/4.8$, is less than the reference voltage $V_{ref}$, i.e. 1.25 volts, that it is when the voltage difference $(V_{PP}-V_{BB})$ is less than 6 volts, i.e. 4.8 times 1.25 volts, the voltage level of the output terminal C of the first voltage comparison circuit 86 is high.

The first voltage divider 82 comprises a third resistor $R_3$ and a fourth resistor $R_4$. The resistance of the third resistor $R_3$ is equal to the resistance of the fourth resistor $R_4$. The upper end of the third resistor $R_3$ is coupled to the output end $V_{PP}$ of the first pump circuit 52, the lower end of the third resistor $R_3$ is coupled to the upper end of the fourth resistor $R_4$, and the lower end of the fourth resistor $R_4$ is coupled to the output end $V_{BB}$ of the second pump circuit 54. Therefore, the voltage level of the output node A of the first voltage divider 82 is equal to $(V_{PP}+V_{BB})/2$. The second voltage divider 84 comprises a fifth resistor $R_5$ and a sixth resistor $R_6$. The resistance of the fifth resistor $R_5$ is equal to the resistance of the sixth resistor $R_6$. The upper end of the fifth resistor $R_5$ is coupled to the first voltage source $V_{DD}$, the lower end of the fifth resistor $R_5$ is coupled to the upper end of the sixth resistor $R_6$, and the lower end of the sixth resistor $R_6$ is coupled to the second voltage source $V_{SS}$. Therefore, the voltage level of the output node B of the second voltage divider 84 is equal to $(V_{DD}+V_{SS})/2$. The second voltage comparison circuit 90 comprises a comparator 92, an inverter 94, a first AND gate 96, and a second AND gate 98. The negative input terminal of the comparator 92 is coupled to the output node A of the first voltage divider 82, and positive input terminal of the comparator 92 is coupled to the output node B of the second voltage divider 84. Therefore, when the voltage level ($V_{PP}$+$V_{BB}$)/2 is less than the voltage level $V_{DD}$/2, the voltage level of the output signal of the comparator 92 is high. And, when the voltage level ($V_{PP}$+$V_{BB}$)/2 is greater than the voltage level $V_{DD}$/2, the voltage level of the output signal of the comparator 92 is low. The inverter 94 is coupled to the output terminal of the comparator 92. The two input terminals of the first AND gate 96 are respectively coupled to the output terminal C of the first voltage comparison circuit 86 and the output terminal of the comparator 92 to execute an AND operation according the voltage levels of the output terminals of the first voltage comparison circuit 86 and the comparator 92. When both the voltage levels of the output terminals of the first voltage comparison circuit 86 and the comparator 92 are high, i.e. when ($V_{PP}$–$V_{BB}$) is less than 6 volts and [($V_{PP}$+$V_{BB}$)/2] is less than $V_{DD}$/2, the voltage level of the first control signal $E_{nP}$ is high to trigger the first pump circuit 52 to be active so that the voltage level $V_{PP}$ is pumped up.

The two input terminals of the second AND gate 98 are respectively coupled to the output terminal C of the first voltage comparison circuit 86 and the output terminal of the inverter 94 to execute an AND operation according the voltage levels of the output terminals of the first voltage comparison circuit 86 and the inverter 94. When both the voltage levels of the output terminals of the first voltage comparison circuit 86 and the inverter 94 are high, i.e. when ($V_{PP}$–$V_{BB}$) is less than 6 volts and [($V_{PP}$+$V_{BB}$)/2] is greater than $V_{DD}$/2, the voltage level of the second control signal $E_{nB}$ is high to trigger the second pump circuit 54 to be active so that the voltage level $V_{BB}$ is pumped down. Finally, ($V_{PP}$–$V_{BB}$) is equal to 6 volts, and [($V_{PP}$+$V_{BB}$)/2] is equal to $V_{DD}$/2. Therefore, the offset ($V_{PP}$–$V_{DD}$) of the output voltage level of the first pump circuit 52 is equal to the offset ($V_{SS}$–$V_{BB}$) of the output voltage level of the second pump circuit 54.

Figure 7:
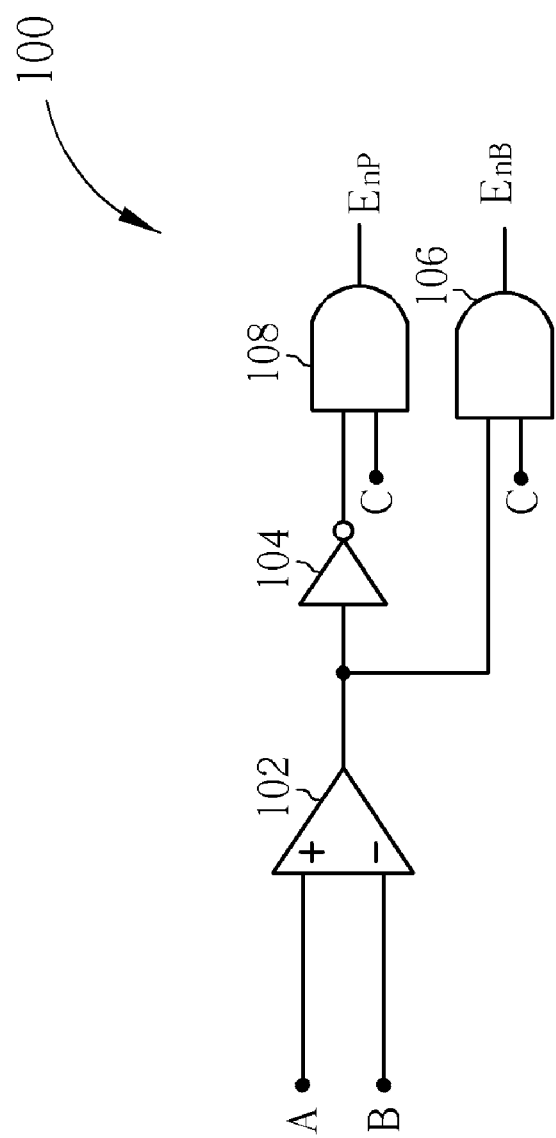
FIG. 7 is a circuit diagram of a second embodiment of the second voltage comparison circuit of the control circuit according to the present invention.

Please refer to FIG. 7, which is a circuit diagram of a second embodiment of the second voltage comparison circuit of the control circuit according to the present invention. The function of the voltage comparison circuit 100 is the same as the function of the second voltage comparison circuit 90 as shown in FIG. 6. The second voltage comparison circuit 100 also comprises a comparator 102, an inverter 104, a first AND gate 106, and a second AND gate 108. Unlike the second voltage comparison circuit 90, the positive input terminal of the comparator 102 of the second voltage comparison circuit 100 is coupled to the output terminal A of the first voltage divider 82, and the negative input terminal of the comparator 102 is coupled to the output terminal B of the second voltage divider 84. The output terminal of the first AND gate 106 is coupled to the second pump circuit 54, and the output terminal of the second AND gate 108 is coupled to the first pump circuit 52.

In contrast with the prior art, the voltage regulator of the present invention outputs positive and negative voltages with the same offsets. Therefore, the number of the capacitors of the first pump circuit is equal to the number of the capacitors of the second pump circuit, so the energy transforming efficiency of the second pump circuit is improved. In addition, because the output voltage offset the second pump circuit maintaining is reduced, the area of the capacitor of the second capacitor can be decreased and the gate thickness of transistors of following stage circuits is not necessary to be too thick. The yield of manufacturing the voltage regulator, hence, is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage regulator coupled to a first voltage source and a second voltage source, the voltage regulator comprising:
   a first pump circuit coupled to the first voltage source;
   a second pump circuit coupled to the second voltage source; and
   a control circuit comprising:
   a first resistor having a first end coupled to an output terminal of the first pump circuit;
      a second resistor having a first end coupled to a second end of the first resistor and a second end coupled to an output terminal of the second pump;
      a first transistor having a first terminal coupled to the output terminal of the first pump circuit and a second end coupled to the second end of the first resistor;
      a second transistor having a first end coupled to a third terminal of the first transistor, a second end and a third end both coupled to the second voltage source;
      a first voltage comparison circuit having a first input terminal coupled to a reference voltage and a second input terminal coupled to the third terminal of the first transistor;
      a first voltage divider coupled to the output terminal of the first pump circuit and the output terminal of the second pump;
      a second voltage divider coupled to the first voltage source and the second voltage source; and
      a second voltage comparison circuit having a first input terminal coupled to the output terminal of the first voltage divider, a second input terminal coupled to the output terminal of the second voltage divider, and a third input terminal coupled to an output terminal of the first voltage comparison circuit, the second voltage comparison circuit being used for controlling operations of the first pump circuit and the second pump circuit according to the voltage levels of the three input terminals of the second voltage comparison circuit.

2. The voltage regulator of claim 1 wherein the second voltage comparison circuit comprises:
   a comparator coupled to the output terminal of the first voltage divider and the output terminal of the second voltage divider for comparing the voltage level of the output terminal of the first voltage divider with the voltage level of the output terminal of the second voltage divider;
   an inverter coupled to an output terminal of the comparator;
   an AND gate having two input terminals respectively coupled to the output terminal of the first voltage comparison circuit and an output terminal of the comparator for executing an AND operation according voltage levels of the output terminals of the first voltage comparison circuit and the comparator; and
   a second AND gate having two input terminals respectively coupled to the output terminal of the first voltage comparison circuit and an output terminal of the inverter for executing an AND operation according voltage levels of the output terminals of the first voltage comparison circuit and the inverter.

3. The voltage regulator of claim 2 wherein the first voltage comparison circuit and the comparator are operational amplifiers.

4. The voltage regulator of claim 2 wherein an output terminal of the first AND gate is coupled to the first pump circuit, and an output terminal of the second AND gate is coupled to the second pump circuit.

5. The voltage regulator of claim 2 wherein an output terminal of the first AND gate is coupled to the second pump circuit, and an output terminal of the second AND gate is coupled to the first pump circuit.

6. The voltage regulator of claim 1 wherein the first transistor and the second transistor have the same electrical characteristics.

7. The voltage regulator of claim 1 wherein the first voltage divider comprises two series connected resistors with the same resistance coupled to the output terminal of the first voltage divider.

8. The voltage regulator of claim 1 wherein the second voltage divider comprises two series connected resistors with the same resistance coupled to the output terminal of the second voltage divider.

9. The voltage regulator of claim 1 wherein the resistance of the first resistor is less than the resistance of the second resistor.

10. The voltage regulator of claim 1 wherein the first voltage comparison circuit is an operational amplifier.

11. The voltage regulator of claim 1 wherein the first transistor and the second transistor are P-type metal-oxide semiconductor (PMOS) transistors, and the first terminal, the second terminal, and the third terminal of each of the transistors are respectively a source, a gate, and a drain of the PMOS transistor.

* * * * *